United States Patent
Uhrmann et al.

(10) Patent No.: US 9,202,993 B2
(45) Date of Patent: Dec. 1, 2015

(54) METHOD FOR PRODUCING A POLYCHROMATIZING LAYER AND SUBSTRATE AND ALSO LIGHT-EMITTING DIODE HAVING A POLYCHROMATIZING LAYER

(75) Inventors: Thomas Uhrmann, Thyrnau (DE); Gerald Kreindl, Scharding (AT)

(73) Assignee: EV Group E. Thallner GmbH (AT)

( * ) Notice: Subject to any disclaimer, the term of this patent is extended or adjusted under 35 U.S.C. 154(b) by 11 days.

(21) Appl. No.: 14/346,029

(22) PCT Filed: Sep. 21, 2011

(86) PCT No.: PCT/EP2011/066439
§ 371 (c)(1),
(2), (4) Date: May 13, 2014

(87) PCT Pub. No.: WO2013/041136
PCT Pub. Date: Mar. 28, 2013

(65) Prior Publication Data
US 2014/0339589 A1    Nov. 20, 2014

(51) Int. Cl.
*H01L 33/50*    (2010.01)
(52) U.S. Cl.
CPC ............ *H01L 33/502* (2013.01); *H01L 33/505* (2013.01); *H01L 2924/0002* (2013.01); *H01L 2933/0041* (2013.01)
(58) Field of Classification Search
None
See application file for complete search history.

(56) References Cited

U.S. PATENT DOCUMENTS

| | | | |
|---|---|---|---|
| 2003/0152703 A1 | 8/2003 | Hammond et al. | 427/256 |
| 2005/0263025 A1* | 12/2005 | Blees | 101/492 |
| 2006/0152150 A1 | 7/2006 | Boerner et al. | 313/506 |
| 2008/0001167 A1* | 1/2008 | Coe-Sullivan et al. | 257/146 |
| 2009/0142876 A1 | 6/2009 | Tuan et al. | 438/70 |
| 2009/0215209 A1 | 8/2009 | Anc et al. | 438/22 |
| 2011/0217809 A1* | 9/2011 | Li | C09D 11/36 438/72 |

FOREIGN PATENT DOCUMENTS

| | | | |
|---|---|---|---|
| JP | 2008-262993 | 10/2008 | G09F 9/33 |
| JP | 2010-505264 | 2/2010 | B29C 59/02 |
| WO | WO 2006/088877 | 8/2006 | H01L 51/100 |
| WO | WO 2008/042079 | 4/2008 | G03F 7/00 |

OTHER PUBLICATIONS

Hiroshima et al. ("Step-and-Repeat Photo-Nanoimprint System Using Active Orientation Head," Japanese Journal of Applied Physics, vol. 43, No. 6B, pp. 4012-4016, 2004).*
International Search for International Application PCT/EP2011/066439, Jun. 5, 2012.
Office Action issued in corresponding Japanese Patent Application No. 2014-531112.

* cited by examiner

Primary Examiner — Yasser A Abdelaziez
(74) Attorney, Agent, or Firm — Kusner & Jaffe

(57) ABSTRACT

The invention relates to a method for applying a polychromatizing layer which contains at least one luminescent means on a semiconductor substrate, which layer is suitable for producing a monochromatic light. The polychromatizing layer is applied with a printing process, especially with a microcontact printing process. Preferably the polychromatizing layer is applied structured.

20 Claims, 3 Drawing Sheets

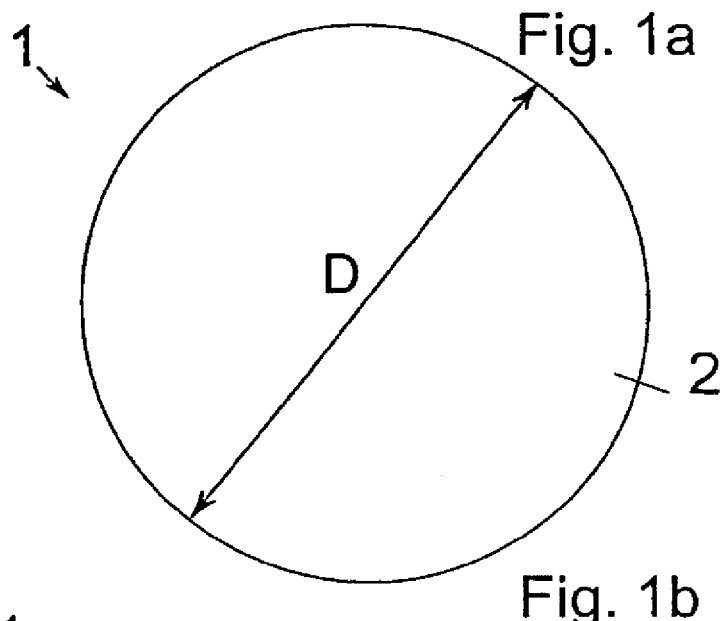
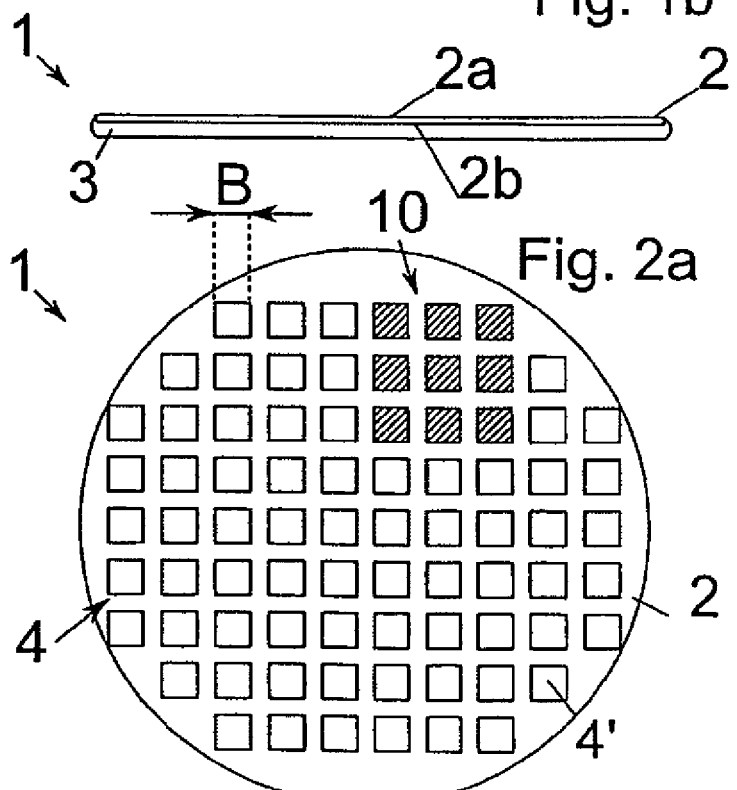

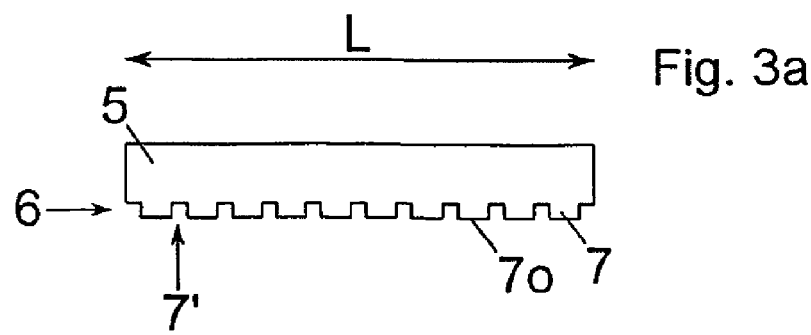
Fig. 3a
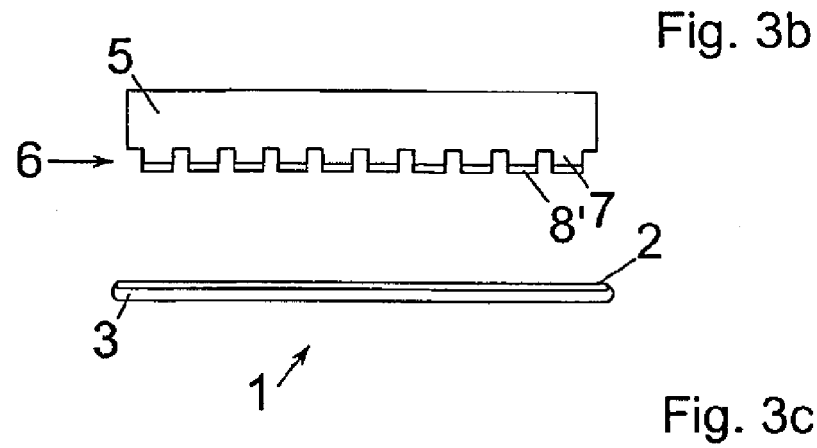
Fig. 3b
Fig. 3c
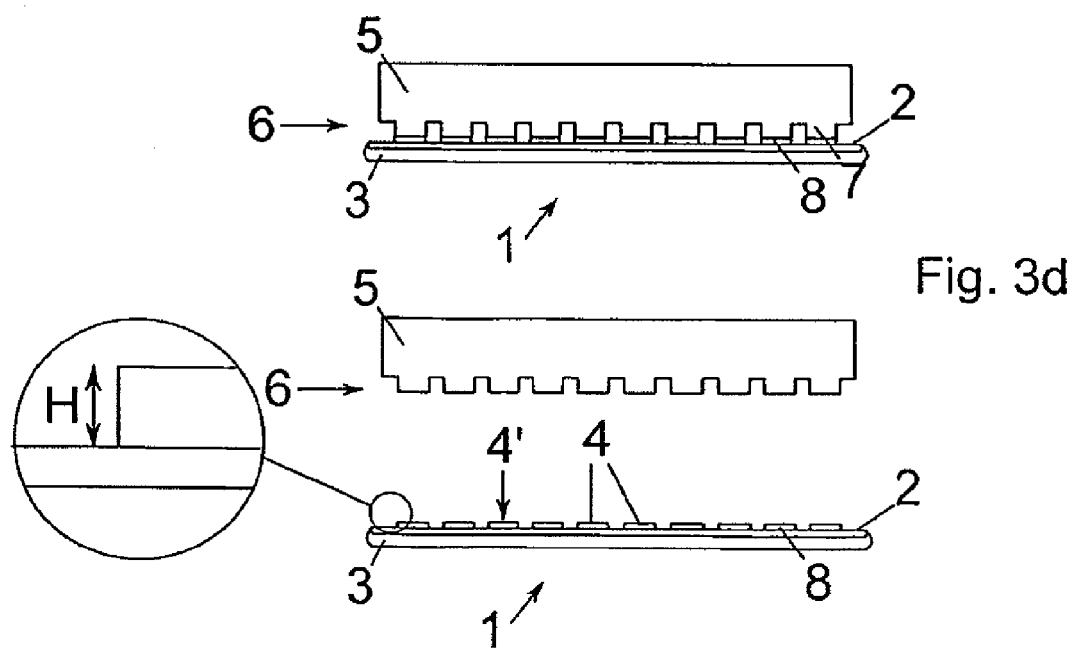
Fig. 3d

METHOD FOR PRODUCING A POLYCHROMATIZING LAYER AND SUBSTRATE AND ALSO LIGHT-EMITTING DIODE HAVING A POLYCHROMATIZING LAYER

FIELD OF THE INVENTION

The invention relates to a method for applying a polychromatizing layer to a semiconductor substrate, a semiconductor substrate, and a light-emitting diode with the semiconductor substrate.

BACKGROUND OF THE INVENTION

An optoelectronic component, called a light-emitting diode or also only LED for short, conventionally contains an epitaxially grown layer sequence which comprises a sublayer which is suitable for light emission, and a conversion layer with a light conversion material.

In the operation of light-emitting diodes, the semiconductor of the sublayer of the epitaxially grown layer sequence, due to its band structure, emits light in a limited spectral range, the light being at least almost monochromatic or having a very narrow wavelength range.

The light conversion material is used to convert the light emitted from the sublayer with respect to its wavelength. This light is incident on the light conversion material which converts the wavelength of the original light to another wavelength. Depending partially on which mechanism exactly underlies the conversion of the wavelength, the light conversion material is called a luminescent material, a photoluminescing material, a fluorescent dye or simply a phosphor. Hereinafter, no distinction is made between the individual mechanisms, and the just mentioned designations for luminescent materials are used side by side without limiting the scope of the disclosure by the use of a special term. Fundamentally however a phosphor can always convert a first light of high frequency only into a second light of lower frequency. This frequency shift effect is known under the name Stokes shift.

The luminescent material or phosphor generally emits a wider spectral range than the light-emitting diode chip, excited by the monochromatic light. Instead of a wider spectral range, several narrowband spectral ranges can also be produced. This can be achieved especially when using several different light conversion materials.

The light-emitting diode ultimately emits a combination of light of the first wavelength and of the second wavelength or of the second wavelengths. A dedicated radiation spectrum of the light-emitting diode can thus be achieved by the dedicated choice of a semiconductor material of the light-emitting sublayer and of the luminescent material. For example a blue-emitting light-emitting diode chip can be combined with a cerium-doped yttrium-aluminum-garnet (YAG) as the luminescent material which converts the blue light partially into yellow light. Together a white light results. Since the phosphor converts the monochromatic light into a wider or at least wider radiation spectrum, it is also called polychromatizing.

The phosphor is conventionally applied by spin coating or spin coating methods to the entire surface of the semiconductor wafer. Here a light conversion layer which extends over an entire wafer is produced. These two methods have a series of disadvantages. Thus a large amount of luminescent material is lost by spinning during the spin coating, as also in other conventional blanket coating methods. Furthermore with these methods only blanket layers can be produced. The layer thickness of the resulting light conversion layers is not homogeneous. In addition to local thickness fluctuations, faults occur which arise along the entire wafer surface. This inhomogeneity of the layer thickness leads to a color variation of light-emitting diodes among one another which is known under the term "binning". For example the white shade of the light-emitting diodes is not constantly the same.

An advantage of the invention is a method with which the aforementioned disadvantages of the prior art are eliminated, with which especially LEDs of uniform conversion layer thickness and thus uniform color spectra can be produced.

The advantage is achieved with the features of Claims 1, 15 and 16. Advantageous developments of the invention are given in the dependent claims. All combinations of at least two of the features given in the specification, the claims and/or the drawings also fall within the framework of the invention. At the given value ranges values which lie within the indicated boundaries will also be considered disclosed as boundary values and will be claimed in any combination.

According to the invention, in the method for applying a polychromatizing layer which contains at least one luminescent material to a substrate which comprises a sublayer which is suitable for emission of monochromatic light, the polychromatizing layer is applied with a printing process.

Here, within the scope of the invention, monochromatic light should not be viewed exclusively as having a single wavelength, but only as having a narrow spectral range, as is conventional in light-emitting diodes without luminescent means.

A polychromatizing layer for the purposes of the invention is a layer which converts light of one wavelength or of the spectral range as is emitted from the sublayer which is suitable for emission of monochromatic light, at least partially to at least one or more second wavelengths. It is irrelevant to the invention by what mechanism this takes place. Light of this second wavelength together with the monochromatic light of the sublayer which is suitable for emission of monochromatic light produces light of several different wavelengths; this is thus called polychromatic. Herein, the term polychromatizing should not be regarded as limiting in the sense that a plurality of different wavelengths is necessarily produced. Even in the case in which light of a single wavelength is converted by the polychromatizing layer to a single other wavelength, the resulting combination of light of two wavelengths is called polychromatizing within the scope of the invention.

Hereinafter, the substrate which comprises a sublayer which is suitable for emission of monochromatic light is called simply a substrate for short.

The method as claimed in the invention, in contrast to the conventional coating methods, enables a layer thickness of the polychromatizing layer to be maintained which has a very low tolerance both inside a polychromatizing layer and also relative to the polychromatizing layer of a batch, such as for example a series of wafers, among one another. Thus, light-emitting diodes can be produced whose emission spectrum is always the same or at least almost the same. This means mainly that in the intensity-wavelength spectrum the shift of the intensity peaks with respect to the wavelength or the change of intensity is negligibly small for different LED chips as claimed in the invention. Advantageously the standard deviation of the positions of the intensity peaks of various samples is less than 10 nm, preferably less than 7 nm, more preferably less than 5 nm, most preferably less than 2 nm, most preferably of all less than 1 nm. Preferably, the standard deviation of the intensity peaks of different samples is less than 5%, preferably less than 1%, more preferably less than 0.1%, most preferably less than 0.01%, most preferably of all less than $10^{-5}$%.

Thus, in light-emitting diodes which are produced with the method as claimed in the invention advantageously no binning occurs.

Advantageously, the deviation of the layer thickness at different positions within an individual polychromatizing layer is less than 10%, especially less than 5%, preferably less than 1%, more preferably less than 0.1%, most preferably less than 0.01%, most preferably of all less than 0.001% relative to the average layer thickness.

Since a printing stamp which is advantageously used in the claimed method in the invention accommodates essentially only the amount of luminescent material which is printed onto the substrate, in contrast to conventional coating methods, no loss or at least hardly any loss of luminescent material occurs.

The printing stamp can advantageously have a printing cavity which is suitable for accommodating the luminescent material to be printed and delivering it to the substrate in one printing step.

According to one preferred embodiment of the invention, the printing process comprises a microcontact printing process. In particular the microcontact printing process constitutes the printing process.

The micro-contact printing process enables an especially exact printing of a substrate. The layer thickness of the polychromatizing layer can thus be exactly adjusted extremely easily. Thus high homogeneities of the layer thickness and thus of the color spectra of the light-emitting diodes with the printed substrate result. The micro-contact printing process is known in and of itself from other fields and is therefore only briefly explained here. A printing stamp, with for example a silicone rubber cavity of a surface or structure which is to be transferred, is provided with a substance which is to be printed and is applied to the surface to be printed, in this case one main surface of the substrate. Here the printing stamp is caused to approach the substrate until the liquid on the stamp comes into contact with the substrate and thus is transferred to the substrate. In what form the luminescent material is used for printing depends on the respective luminescent material, the cavity material of the printing stamp and other parameters of the printing process such as the desired layer thickness or the printing temperature, and is chosen by one skilled in the art as desired or required, without becoming inventive. The micro-contact printing process has never yet been used to apply a polychromatizing layer to a substrate which comprises a sublayer which is suitable for emission of monochromatic light. Surprisingly, this printing process which was not developed specially for substrate surfaces and the printing of the substrate surfaces with luminescent material can be applied to substrates. This is especially surprising since micro-contact printing processes have been used to date primarily in the transfer of very thin, preferably monolayers of material, especially of homogeneous materials to target surfaces. In the past these target surfaces were often surfaces with very high quality with respect to evenness, surface roughness and defects, and of special composition, for example with gold coating. The properties of the substrates which are to be printed as claimed in the invention are significantly different with respect to these quality criteria. Thus these surfaces often have defects such as projecting peaks which originate from epitaxial growth of the layer structure ("growth spikes").

Instead of the micro-contact printing process, another suitable printing process can also be used especially for coarser structures.

According to one preferred embodiment of the invention, the polychromatizing layer is applied in a structured manner. This is possible first of all by the use of a printing process as claimed in the invention. Depending on the desired structure of the polychromatizing layer, a printing stamp with a structure of the printing cavity which corresponds to the structure of the polychromatizing layer is prepared on the printing stamp. The use of a structure of the polychromatizing layer can cause advantageous effects. Thus for example decoupling of the light from the polychromatizing layer can be promoted in a dedicated manner. The color spectra can also be adjusted in a dedicated manner.

Structured printing is especially easily possible with the micro-contact printing process since with the latter complicated or very fine structures can be printed with high precision.

According to one embodiment of the invention, the polychromatizing layer, which has been applied structured, has individual elements which encompass rectangles, squares, circles, triangles, filled polygons and similar individual elements. This is possible due to correspondingly structured elevations and depressions on the printing cavity of the printing stamp used.

Advantageously the individual elements can have a structure width which is less than 100 µm, especially less than 10 µm, especially less than 1 µm. The structure width in the case of squares is the edge length, in the case of circles the diameter and for all other geometrical shapes of the individual elements their greatest overall extension; for a triangle for example this is the greatest possible height of the triangle. The homogeneity of the color spectra obtained is especially high due to structure elements this small, and color spectra can be set in an especially dedicated manner.

It can be advantageous for the polychromatizing layer to be printed with a layer thickness (D) which is less than 100 µm, especially less than 10 µm, especially less than 1 µm. With the method as claimed in the invention, even at such small layer thicknesses a high homogeneity of the layer thickness can be achieved.

According to one preferred version of the invention a wafer is printed as the substrate. Thus the application of a polychromatizing layer as claimed in the invention can be easily integrated into a wafer process in which for example other conventional process steps for producing light-emitting diodes take place.

According to one embodiment of in the invention, in one printing step a printing stamp can be used whose size corresponds at least largely to the size of the substrate so that the printing process comprises a single printing step. When a wafer as a substrate is printed, the size of the printing stamp corresponds at least largely to the size of the substrate.

According to one embodiment of the invention, the size of the printing stamp is less than the size of the substrate such that the polychromatizing layer is applied by a plurality of printing steps. This gradual copying of a substructure is also known as the "step-and-repeat method". It has therefore been used in other areas of semiconductor technology and is therefore explained only briefly here with respect to the method as claimed in the invention. A printing stamp is provided with the liquid or mass which is to be printed, and with the former a subdivision layer is applied to the substrate at a starting point on the substrate. For example according to the type of rows and columns in addition to this first subdivision layer a plurality of subdivision layers is printed on which yield a layer which for example covers the entire substrate. If the printing stamp has a printing cavity with elevations and depressions which yield a structured subdivision layer on the substrate, the subdivision layers can be advantageously printed next to one another such that an overall structure arises which is identical to a structure of a single large printing stamp, which structure is applied by a single printing step.

Alternatively, subdivision layers which do not supplement one another to form an overall structure can be printed next to one another. In this case in a later process step the substrate can be cut between the individual sublayers such that a resulting light-emitting diode has one subdivision layer.

The application of the punch material to the elevations of the printing stamp can be done by several methods. The elevations of the printing stamp can for example dip into the punch material liquid in a controlled manner. The punch material will easily adhere to the elevations by the adhesion force. Afterwards the printing stamp is easily drawn out of the punch material liquid and moved to the wafer. In another version small, exactly portioned amounts of punch material are applied by droplet deposition on the wafer. The droplet positions must be congruent with the positions of the elevations on the stamp.

In another embodiment, the printing stamp can be turned upside down so that the elevations point up against gravity. Accordingly, the printing stamp is coated with the punch material using a spray method. Droplets of punch material remain on the surface of the elevations. The relative motion between the punch and the wafer can move both into position. Accordingly a type of "overhead stamping" takes place by movement onto one another between the punch and wafer. For one skilled in the art in the field, it is clear that the type and manner in which the punch material liquid travels onto the elevations of the stamp is not decisive for the embodiments as claimed in the invention.

During the punching process the distance between the printing stamp and wafer is preferably measured and/or actively controlled so that the layer thickness of the layer elements can be set in a controlled manner.

The punch can also have a thick elastic layer which goes in front of the elevations. This thick elastic layer is used for compensation of irregularities of the wafer. In this way, more uniform printing properties are achieved. In particular for extremely rigid stamps, a punching of several layer elements on an uneven wafer could only be poorly done or not done at all. Therefore a multilayer stamp is also disclosed, therefore a stamp which consists of different material layers which are arranged in a row normal to the punch direction in a serial combination.

In another embodiment, the stamp elements are applied on a stiff but ductile membrane. The membrane can be convexly molded, preferably via an overpressure which is applied behind the membrane and which can be built up in a chamber. This type of stamp is used to act on the membrane and thus the stamps with an isostatic (gas) pressure.

Instead of as a structured layer, the polychromatizing layer according to one alternative of the invention can be applied in a blanket manner to the substrate. Even without applying the polychromatizing layer in a structured manner, the method as claimed in the invention has advantages over the prior art since a blanket polychromatizing layer which is applied with the method as claimed in the invention has a much more homogenous layer thickness both within the layer on a printed substrate and also within a batch, such as a series of wafers.

Another advantage, which is also of significant economic benefit with blanket application to the substrate, is comprised in the material efficiency which is enormously increased over the prior art. For spin coating methods, it is conventional that more than 50% of the originally used material is spun off the substrate during the spinning process. This material can no longer be used due to the risk of contamination and is scrap. In contrast, the micro-contact printing process makes it possible to reduce the material loss to <15%, often to <10%, in optimized methods even to <5%. In this respect, it is irrelevant whether the method is set up such that for each individual printing step a complete transfer of the luminescent material adhering to the stamp to the substrate takes place, since the remaining material which remains adhering to the stamp in incomplete transfer is not lost, but is used again in the next printing step.

The method as claimed in the invention can also be used for coating of all semiconductor materials, for example for semiconductor substrates of Si, GaAs, GaN, etc. According to the selected semiconductor material, color spectra which are characteristic in operation are emitted from the substrate. The choice of at least one luminescent material of the polychromatizing layer depends on this color spectrum and on which color spectrum the light-emitting diode to be produced is to ultimately emit, or into which wavelengths the originally emitted light is to be converted. One skilled in the art is able to define the suitable combination of semiconductor material and luminescent material in order to achieve the desired wavelength spectrum without becoming inventive. The luminescent materials are surrounded by a matrix material. Primarily phosphor is used as the luminescent material. Moreover, all materials are disclosed which have fluorescent and/or phosphorescent properties. As the matrix materials the following materials are used, but not exclusively:

silicones
polymers
polyimides
glasses
generally, all materials which are able to dissolve luminescent materials and are transparent to the electromagnetic radiation which is emitted by luminescence.

Depending on this, one skilled in the art will choose at least one luminescent material and produce or prepare from it a printable liquid or mass which can be printed as polychromatizing material. This can be for example a solution or a dispersion. The dispersion is for example a conventional enamel as is used also for spin coating of wafers. In order to achieve high homogeneity even at low layer thicknesses of the polychromatizing layer, preferably a dispersed luminescent material is used with a particle size of preferably less than 50 μm, more preferably less than 10 μm, even more preferably less than 100 nm, most preferably less than 10 nm, most preferably of all less than 1 nm for printing of the substrate. In addition to the method for applying the luminescent material to the substrates, the luminescent materials themselves are subject to continuous development. The method as claimed in the invention has a high tolerance with respect to the particle size used. Therefore the particle sizes mentioned above here should be regarded as exemplary and not as a limitation to the method as claimed in the invention.

At least one luminescent material can be selected for example, but not exclusively, from one of the following groups:

white phosphorus
phosphorescing pure components, therefore elements or molecules
phosphorescing liquids such as for example enamels
all types of crystals which can produce phosphorescence by disruption of the lattice structures, mainly sulfides of the alkaline earth metals and of zinc which have been mixed with heavy metal salts.

all types of luminescing materials which can be dissolved in a matrix which is transparent to the radiation which has been produced by luminescence.

Which wavelengths are produced by a semiconductor of the substrate and to what wavelengths this light is converted depend on the material of this substrate and the polychromatizing layer. One skilled in the art knows substrate materials and materials of polychromatizing layers and can use and combine them as desired or required for a desired LED. The method as claimed in the invention is not limited to certain substrate materials or polychromatizing layers.

According to one version of the invention, a liquid which forms a polychromatizing layer and/or printable mass can be applied with the printing process. In the case of a solution as the liquid, a solvent of the solution must dry so that the polychromatizing layer is formed. In the case of molten masses, they must harden into a polychromatizing layer. What approach is chosen depends largely on the type of luminescent material.

Advantageously a liquid or printable mass from the group of solutions, dispersions and enamels is printed as the liquid and/or printable mass.

After printing, the printed mass is treated by methods which are known to one skilled in the art in the field. This treatment can include thermal and/or optical, and/or electrical and/or chemical curing methods which provide for the mass' curing, therefore remaining of stable shape. Preferably for this purpose the LED located under the mass is used to effect curing by thermal and/or optical processes by the LED being activated after the printing process.

Other measures which improve the invention are detailed below jointly with the description of one preferred exemplary embodiment of the invention using the figures.

BRIEF DESCRIPTION OF THE DRAWINGS

FIG. 1a shows a plan view of a wafer which is to be printed;

FIG. 1b shows a sectional view of the wafer from FIG. 1a on a wafer carrier;

FIG. 2a shows a schematic plan view of a wafer printed with a method as claimed in the invention;

FIG. 2b shows a schematic sectional view of the wafer from FIG. 2a;

FIG. 3a shows a schematic sectional view of a printing stamp for the method as claimed in the invention;

FIG. 3b shows a schematic sectional view of the printing stamp which is wetted with a dispersion over a wafer to be printed;

FIG. 3c shows a schematic sectional view of the printing stamp from FIG. 3b in contact with the wafer;

FIG. 3d shows a schematic sectional view of the wafer and of the printing stamp after the printing step;

DETAILED DESCRIPTION OF THE PREFERRED EMBODIMENT

Figure 4A:
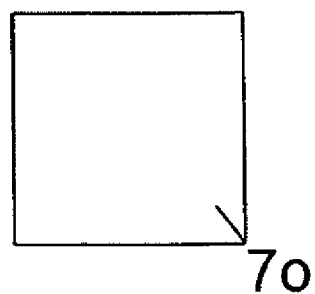
FIG. 4a shows a plan view of a square elevation of a printing cavity.

With a method as claimed in the invention, a wafer 1 is printed which has a substrate 2 which is supported by a carrier 3 (see FIGS. 1a and 1b). The substrate 2 has a monochromatic light-emitting sublayer (not shown) which is gallium arsenide-based. For the sake of simplicity, the sublayer 2 which has a monochromatic light-emitting GaAs sublayer is called a GaAs substrate 2 below. The GaAs substrate 2 has a first main surface 2a which faces away from the carrier 3 and a second main surface 2b which is facing the carrier 2. The GaAs substrate 2 is grown epitaxially onto the carrier 3.

As is shown in FIGS. 3a to 3d, a polychromatizing layer 4 is applied to the GaAs substrate 2 with a printing stamp 5. The printing stamp 5 has a structure 6 which is placed in a printing cavity 7o which has elevations 7 and depressions 7'.

The stamp 5 is provided with a dispersion in which particles of cerium-doped yttrium-aluminum garnet (YAG) are dispersed such that the elevations 7 are wetted with a film 8 of this dispersion. Each individual elevation 7 is wetted with one film element 8'. By lowering the printing stamp 5 onto the substrate 2 (FIG. 3b and FIG. 3c) the film 8 approaches the substrate 2 until the film 8 is transferred onto the substrate 2 by contact of the film 8 with the substrate 2. After removing the printing stamp 5 the film 8 is left as a layer 4 on the substrate 2 (FIG. 3d). The layer 4 has a plurality of individual layer elements 4', which with respect to their geometry and preferably thickness, correspond at least largely to the geometry and thickness of the individual film elements 8'.

In one embodiment of the method as claimed in the invention, it is also conceivable that the film elements 8' are only partially transferred onto the substrate 2 with respect to their thickness. That is, that after removal of the printing stamp 5 only one part of the film 8 is left as a layer 4 on the substrate 2. The part of the layer 8 which has not been transferred to the substrate is left on the printing stamp 5 and can be used in the printing of a next substrate 2. Here it is advantageously provided as claimed in the invention that the film 8 be refilled with respect to its thickness so that in a next printing process identical initial conditions as in the preceding printing process prevail. The thickness ratio between the layer 4 which has been transferred to the substrate 2 and the remainder of the layer 8 which is left on the stamp depends on the parameters such as stamp material, the interaction of the stamp material with the luminescent material, the interaction of the luminescent material with the surface of the substrate 2, viscosity of the luminescent material, etc. Often >50% of the layer thickness of the layer 8 are transferred to the substrate 2. Preferably this value is >70%, for optimized methods >80%, even more preferably >90%.

The printing stamp 5 in this case is a micro-contact printing stamp whose silicone rubber printing cavity 7o is provided with a fine structure 6 which comprises square elements 9 whose width B is 50 μm. Accordingly the individual film elements 8' and thus the layer elements 4' likewise have widths B of 50 μm.

The structure 6 and thus among others the elevations 7 and the layer elements 4' are not shown to scale in the figures. Accordingly, the number of layer elements 4' of the polychromatizing layer 4 is several times greater than schematically shown. It is indicated in FIGS. 3a to 3d that the layer 4 in FIGS. 2a and 2b is printed onto the wafer 1 as substrate 2 in a single printing step. In this case the length L of the printing stamp 5 is essentially exactly as great as the diameter D of the wafer 1. In one version of the exemplary embodiment, in one printing step only one subdivision layer 10 consisting of a smaller number of layer elements 4' is applied to the substrate 2, as are shown cross-hatched in FIG. 2a. In this case the length L of the printing stamp is much smaller than the diameter D of the wafer 1. By a step-and-repeat process, a printing stamp 5 which has a printing cavity with a structure which corresponds to the subdivision layer 10 (not shown) is wetted with a dispersion and gradually positioned over the wafer 1 and lowered onto it. Due to the high precision of the step-and-repeat process a layer 4 with the same structure 6 can be produced as is produced by a single printing step for a correspondingly larger printing stamp 5. The layer thickness is 5 µm in the exemplary embodiment.

Wedge fault compensation is carried out before printing. In the version of the step-and-repeat process the wedge fault compensation can preferably be once per wafer or even only once per series of wafers.

In one version of the exemplary embodiment, the printing cavity 7o is not structured, but made blanketing (not shown) so that the film 8 on the printing stamp 5 and thus also the polychromatizing layer 4 which has been printed on the substrate 2 are blanketing.

Figure 4B:
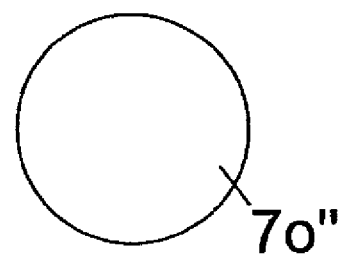
FIG. 4b shows a plan view of a round elevation of a printing cavity.

Besides the square cross section 7o' of the elevations 7 (see FIG. 4a) and thus of the layer element 4', in another version of the exemplary embodiment there are elevations 7 with a round cross section 7o" (see FIG. 4b).

Figure 4C:
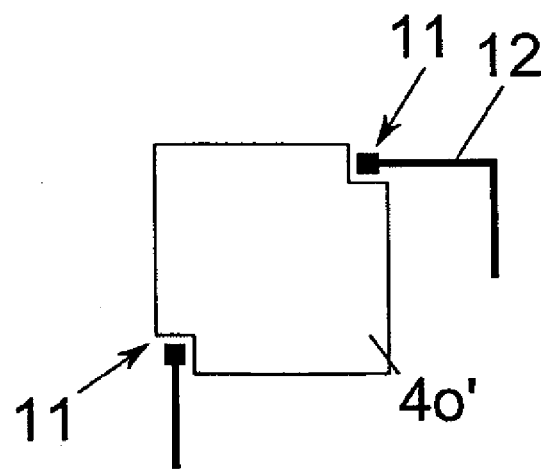
FIG. 4c shows a plan view of a printed, square layer element with recesses and contacts.

Due to the advantage of the invention of printing even complicated structures 6, especially with the micro-contact printing process, according to another version of the invention, it is possible to modify a square cross section of the elevations 7 such that as is shown in FIG. 4c a layer element 4' with a cross section 4o' which has recesses 11 is printed. In this version of the invention, a single layer element 4' is printed per light-emitting diode and the recesses 11 are used as contact-making regions of the LEDs with connecting elements 12, for example bond wires, vapor-deposited printed circuits or any other connecting element 12.

The substrates 2 which are printed with the method as claimed in the invention with polychromatizing layers 4 are finished to form light-emitting diodes and placed in operation using conventional methods. They have a very high homogeneity in the layer thickness of the polychromatizing layer 4 and thus a uniform quality of the resulting color spectra in the operation of the light-emitting diodes. The blue light of the substrate 2 is partially converted into yellow light by the polychromatizing layer 4 and are together emitted as white light from the light-emitting diode. No binning occurs, but the white shade of the light-emitting diodes is homogeneous and of uniform quality within a series of wafers.

REFERENCE NUMBER LIST 1 wafer
2 substrate
2a first main surface
2b second main surface
3 carrier
4 layer
4' layer elements
4o' cross section
5 printing stamp
6 structure
7 elevation
7' depression
7o printing cavity
7o' square cross section
7o" circular cross section
8 film
8' film element
9 square individual elements
10 subdivision layer
11 recesses
12 connecting elements
B width Having described the invention, the following is claimed:

1. A method for applying a layer onto a semiconductor substrate, said semiconductor substrate containing a sublayer that emits light, said method comprising the steps of:
   applying a layer that is polychromatizing and that contains at least one luminescent material to a surface of a substrate;
   orienting the substrate and the semiconductor substrate such that the surface of the substrate aligns with and faces a surface of the semiconductor substrate;
   moving the surface of the substrate and the surface of the semiconductor substrate into contact with each other wherein the layer is printed onto the surface of the semiconductor substrate.

2. The method as claimed in claim 1, wherein the layer is printed onto the surface of the semiconductor substrate by a micro-contact printing process.

3. The method as claimed in claim 1 or 2, wherein the substrate is a printing stamp having a printing cavity.

4. The method as claimed in claim 1, wherein the polychromatizing layer is applied to the semiconductor substrate as a patterned structure.

5. The method as claimed in claim 4, wherein the patterned structure includes individual layer elements which comprise rectangles, squares, circles, triangles, filled polygons or similar layer elements.

6. The method as claimed in claim 5, wherein the layer elements have a structure width (B) which is less than 1 mm.

7. The method as claimed in one of claim 1 or 2, wherein the polychromatizing layer is printed in a blanket manner on the semiconductor substrate.

8. The method as claimed in claim 1, wherein the polychromatizing layer has a layer thickness (H) which is less than 100 µm.

9. The method as claimed in claim 1, wherein the semiconductor substrate is a wafer is printed.

10. The method as claimed in claim 1, wherein in one printing step a printing stamp is used whose length (L) corresponds at least largely to the diameter of the semiconductor substrate so that the polychromatizing layer is applied in a single printing step.

11. The method as claimed in claim 1, wherein in one printing step a printing stamp is used whose length (L) is less than the diameter of the semiconductor substrate so that the polychromatizing layer is applied by a plurality of printing steps.

12. The method as claimed in claim 1, wherein at least one luminescent material is selected from the group consisting of:
   white phosphorus;
   phosphorescing pure components, therefore elements or molecules;
   phosphorescing liquids;
   crystals which can produce phosphorescence by disruption of the lattice structures, mainly sulfides of alkaline earth metals and of zinc which have been mixed with heavy metal salts; and
   luminescing materials which can be dissolved in a matrix which is transparent to the radiation which has been produced by luminescence.

13. The method as claimed in claim 1, wherein the polychromatizing layer is a liquid and/or printable mass.

14. The method as claimed in claim 13, wherein the liquid and/or printable mass includes a solution, a dispersion or an enamel.

15. Semiconductor substrate containing a semiconductor layer for producing monochromatic light, the semiconductor substrate including a polychromatizing layer, wherein the polychromatizing layer is applied as a patterned structure, with a method according to claim 1.

16. Optoelectronic component with a semiconductor substrate according to claim 15.

17. The method as claimed in claim 5, wherein the layer elements have a structure width (B) less than 100 μm.

18. The method as claimed in claim 5, wherein the layer elements have a structure width (B) less than 10 μm.

19. The method as claimed in claim 5, wherein the layer elements have a structure width (B) less than 1 μm.

20. A method for applying a layer onto a semiconductor substrate, said method comprising the steps of:
- providing said semiconductor substrate containing a sublayer that emits light;
- applying a layer that is polychromatizing and that contains at least one luminescent material to a surface of a substrate;
- orienting the substrate and a semiconductor substrate such that the surface of the substrate aligns with and faces a surface of the semiconductor substrate; and
- moving the surface of the substrate and the surface of the semiconductor substrate into contact with each other wherein at least a portion of the layer on the surface of the substrate is printed onto the surface of the semiconductor substrate and wherein the light emitted by said sublayer is at least partially converted by the layer printed on the surface of the semiconductor substrate to produce light having at least two wavelengths.

* * * * *